US009633885B2

(12) United States Patent
Lee

(10) Patent No.: US 9,633,885 B2
(45) Date of Patent: Apr. 25, 2017

(54) VARIABLE ELECTRODE PATTERN FOR VERSATILE ELECTROSTATIC CLAMP OPERATION

(71) Applicant: Axcelis Technologies, Inc., Beverly, MA (US)

(72) Inventor: William Davis Lee, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 397 days.

(21) Appl. No.: 14/178,719

(22) Filed: Feb. 12, 2014

(65) Prior Publication Data

US 2015/0228523 A1 Aug. 13, 2015

(51) Int. Cl.
*H01T 23/00* (2006.01)
*H01L 21/683* (2006.01)
*H02N 13/00* (2006.01)

(52) U.S. Cl.
CPC ...... *H01L 21/6833* (2013.01); *H01L 21/6831* (2013.01); *H02N 13/00* (2013.01)

(58) Field of Classification Search
USPC ........................................................ 361/234
See application file for complete search history.

(56) References Cited

U.S. PATENT DOCUMENTS

| 4,692,836 | A | * | 9/1987 | Suzuki | H01L 21/6831 279/128 |
|---|---|---|---|---|---|
| 5,179,498 | A | * | 1/1993 | Hongoh | H01L 21/6831 269/8 |
| 5,452,177 | A | * | 9/1995 | Frutiger | H01L 21/6831 279/128 |
| 5,671,116 | A | * | 9/1997 | Husain | H01L 21/67103 361/234 |
| 5,969,934 | A | * | 10/1999 | Larsen | H01L 21/6833 279/128 |
| 6,922,324 | B1 | * | 7/2005 | Horwitz | H01L 21/6831 279/128 |
| 7,385,799 | B1 | * | 6/2008 | Purohit | H01L 21/6833 361/234 |
| 2002/0114124 | A1 | * | 8/2002 | Rhoads | H01L 21/6833 361/234 |
| 2008/0192405 | A1 | * | 8/2008 | Purohit | H02N 13/00 361/234 |
| 2010/0182036 | A1 | * | 7/2010 | Regan | H01L 21/67265 324/764.01 |

* cited by examiner

*Primary Examiner* — Danny Nguyen
(74) *Attorney, Agent, or Firm* — Eschweiler & Potashnik, LLC

(57) ABSTRACT

An electrostatic clamp (ESC) has a clamping surface, and first and second pairs of electrodes. Each of the first pair of electrodes are associated with a respective third of the clamping surface, and each of the second pair of electrodes are associated with a respective sixth of the clamping surface. A peripheral region of each of the first and second pairs of electrodes spirals toward the periphery of the clamping surface. A DC mode connects one of each of the first and second pair of electrodes to a positive and the other one of the respective first and second pair of electrodes to a negative of a power supply. An AC mode electrically connects first, second, and third phase terminals of the power supply to one of the first pair of electrodes, the other one of the first pair of electrodes, and both of the second pair of electrodes, respectively.

20 Claims, 4 Drawing Sheets

VARIABLE ELECTRODE PATTERN FOR VERSATILE ELECTROSTATIC CLAMP OPERATION

TECHNICAL FIELD

The present disclosure relates generally to electrostatic clamps and more specifically to an electrostatic clamping system having a configurable electrode pattern for selective operation in AC and DC modes.

BACKGROUND

Electrostatic clamps or chucks (ESCs) are often utilized in the semiconductor industry for clamping workpieces or substrates during plasma-based or vacuum-based semiconductor processes such as ion implantation, etching, chemical vapor deposition (CVD), etc. Conventionally, a semiconductor processing system and associated ESC is designed to clamp a workpiece by energizing electrodes associated with the ESC by one of alternating current (AC) or direct current (DC). Often, temperatures at which the workpiece is processed dictates whether AC or DC power is utilized. For example, under low processing temperature conditions, DC power can be utilized to attain greater clamping forces than AC power. However, DC power has drawbacks, such as inducing residual clamping forces after the DC power is removed.

At higher temperatures, AC power can be utilized, as resistivity of the ESC decreases as processing temperatures increase, and lower voltage AC power can be advantageous. Further, de-clamping times can be decreased by utilizing AC power at such higher temperatures. As such, sufficient clamping forces can be attained by utilizing AC power at higher temperatures.

Conventionally, however, ESCs have a predetermined style or pattern of electrodes that is optimized for AC or DC operation of the ESC. Accordingly, a first ESC and power supply is typically used for AC operation, while a second ESC and power supply are utilized for DC operation, where each of the first and second ESCs have corresponding electrode patterns optimized for their respective AC or DC operation. Accompanying costs and system downtime are typical when changing ESCs, thus deleteriously affecting production.

SUMMARY

A need has been determined for an ESC and clamping system configured to operate at various temperatures and in different power schemes. The present disclosure details an ESC and clamping system, wherein the ESC is capable of AC and DC clamping, is suitable to be run at both high and low temperatures, and can be easily switched between operating modes in order to provide a cost-effective solution to the equipment seen in the prior art.

The present invention overcomes the limitations of the prior art by providing a system, apparatus, and method for powering a single ESC having a selectable electrode pattern. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one aspect, an electrostatic clamping system is provided comprising an electrostatic clamp having a clamping surface associated therewith. The electrostatic clamp comprises a first pair of electrodes and a second pair of electrodes, wherein each of the first pair of electrodes are associated with a respective one-third of the clamping surface, and wherein each of the second pair of electrodes are associated with a respective one-sixth of the clamping surface. A power supply is configured to selectively output a DC clamping voltage and a three-phase AC clamping voltage. Further, a controller is configured to selectively operate the electrostatic clamp in a DC mode and an AC mode.

In the DC mode, the controller electrically connects one of the first pair of electrodes and one of the second pair of electrodes to a positive terminal of the power supply and the other one of the first pair of electrodes and other one of the second pair of electrodes to a negative terminal of the power supply. In the AC mode, the controller electrically connects a first phase terminal of the power supply to one of the first pair of electrodes, a second phase terminal of the power supply to the other one of the first pair of electrodes, and a third phase terminal of the power supply to both of the second pair of electrodes.

According to one exemplary aspect, each of the first pair of electrodes and second pair of electrodes are defined by a central region associated with a center of the clamping surface and a peripheral region associated with a periphery of the clamping surface. The central region and peripheral region of each of the first pair of electrodes and second pair of electrodes, for example, are respectively contiguous to one another. In one example, the central region of each of the first pair of electrodes and second pair of electrodes is generally pie shaped. In another example, the peripheral region of each of the first pair of electrodes and second pair of electrodes generally tapers a width of the respective the first pair of electrodes and second pair of electrodes toward the periphery of the clamping surface. The peripheral region of each of the first pair of electrodes and second pair of electrodes, for example, is generally spiral shaped.

According to another aspect, a method for clamping a workpiece to an ESC is provided, wherein one of a DC clamping mode and an AC clamping mode is selected based on one or more process parameters associated with a processing of the workpiece. The selection between AC and DC clamping modes can be performed prior to, or during, clamping of the workpiece to the ESC.

In the DC clamping mode, one of the first pair of electrodes and one of the second pair of electrodes is electrically connected to a positive terminal of a DC power supply and the other one of the first pair of electrodes and other one of the second pair of electrodes to a negative terminal of the DC power supply. In the AC clamping mode, a first phase terminal of an AC power supply is electrically connected to one of the first pair of electrodes, a second phase terminal of the AC power supply is electrically connected to the other one of the first pair of electrodes, and a third phase terminal of the AC power supply is electrically connected to both of the second pair of electrodes.

The above summary is merely intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and

DETAILED DESCRIPTION

Figure 1:
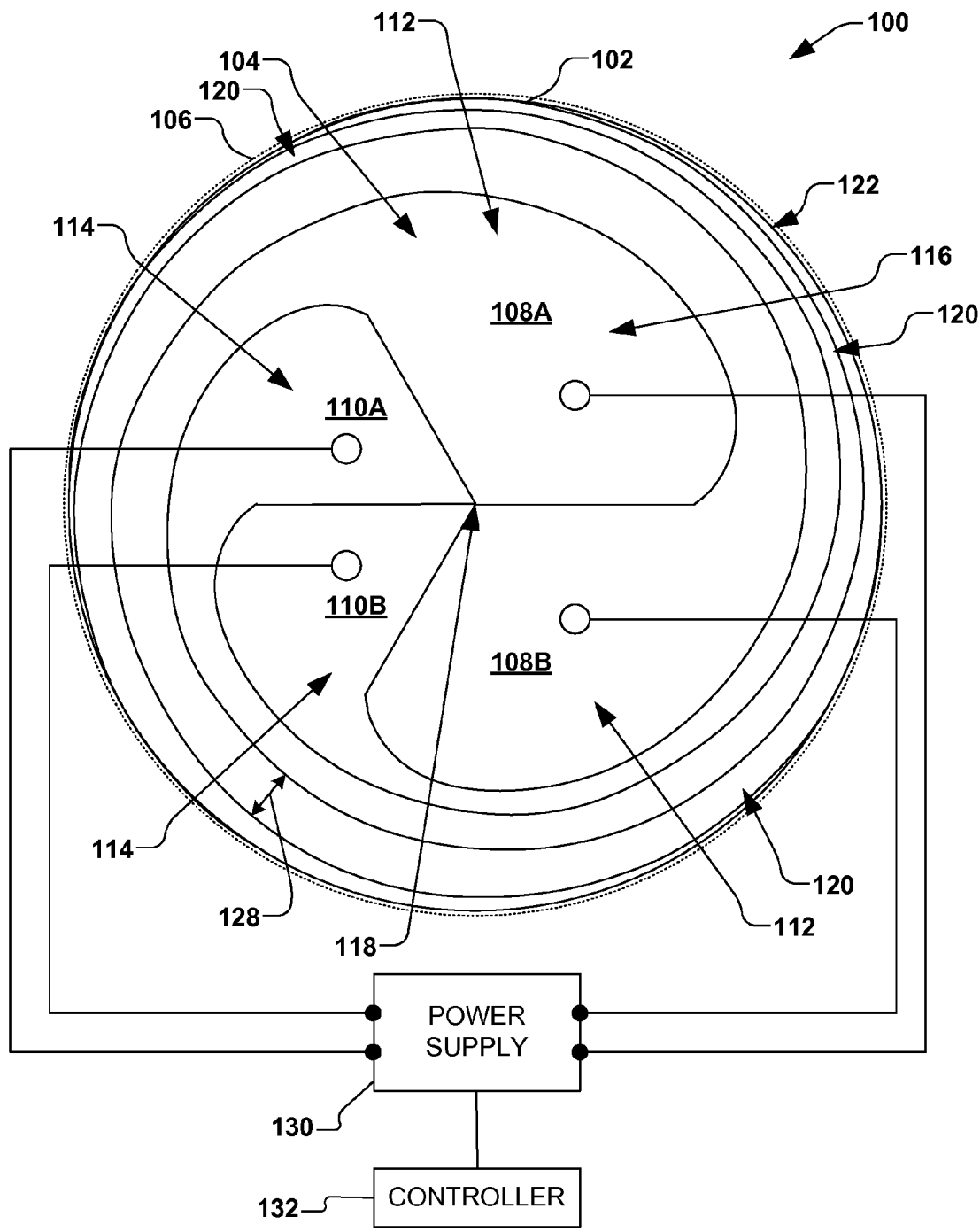
FIG. 1 is a block diagram of an exemplary electrostatic clamping system in accordance with several aspects of the present disclosure.

The present disclosure is directed generally toward a system, apparatus, and method for electrostatically clamping a workpiece to an electrostatic clamp. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

In accordance with one aspect of the present disclosure, FIG. 1 illustrates an exemplary electrostatic clamping system 100. The electrostatic clamping system 100 comprises an electrostatic clamp (ESC) 102 having a clamping surface 104 associated therewith, wherein the clamping surface is configured to support a workpiece 106 (shown in phantom) thereon. In the present example, the ESC 102 comprises a first pair of electrodes 108A, 108B and a second pair of electrodes 110A, 110B, wherein each of the first pair of electrodes are associated with a respective one-third 112 of the clamping surface, and wherein each of the second pair of electrodes are associated with a respective one-sixth 114 of the clamping surface 104 of the ESC. Each of the first pair of electrodes 108A, 108B and second pair of electrodes 110A, 110B are comprised of an electrically conductive material and may be further encapsulated and/or covered by an insulative or dielectric material, therein defining the clamping surface 104.

In the present example, the first pair of electrodes 108A, 108B abut one another, and the second pair of electrodes 110A, 110B abut one another. However, other configurations are contemplated, such as the first pair of electrodes 108A, 108B being interleaved between the second pair of electrodes 110A, 110B. Regardless of orientation with respect to one another, each of the first pair of electrodes 108A, 108B in the present disclosure represent the respective one-third 112 of the clamping surface 104, and each of the second pair of electrodes 110A, 110B are associated with the respective one-sixth 114 of the clamping surface of the ESC 102.

In accordance with one example, each of the first pair of electrodes 108A, 108B and second pair of electrodes 110A, 110B are defined by central region 116 associated with a center 118 of the clamping surface 104 and a peripheral region 120 associated with a periphery 122 of the clamping surface. An area of the central region 116, in one example, is greater than an area of the peripheral region 120 when viewed perpendicular to the clamping surface 104. Alternatively, the area of the central region 116 can be less than or equal to the area of the peripheral region 120 when viewed perpendicular to the clamping surface 104, wherein the areas can be selected based on clamping requirements, such as a greater clamping force near the central region 116 or peripheral region 120.

In a preferred embodiment, the central region 116 and peripheral region 120 of each of the first pair of electrodes 108A, 108B and second pair of electrodes 110A, 110B are respectively contiguous to one another. As such, no additional interconnection layer (not shown) is required to electrically connect the central region 116 and peripheral region 120 of each of the first pair of electrodes 108A, 108B and second pair of electrodes 110A, 110B. It should be noted, however, that while the first pair of electrodes 108A, 108B and the second pair of electrodes 110A, 110B are illustrated as being contiguous, each of the first pair of electrodes and the second pair of electrodes can further comprise an electrically conductive interconnection (not shown) that electrically connect the central region 116 and peripheral region 120 of each of the first pair of electrodes and second pair of electrodes.

In accordance with the example illustrated in FIG. 1, the central region 116 of each of the first pair of electrodes 108A, 108B and second pair of electrodes 110A, 110B is generally pie shaped. Further, in the present example, the peripheral region 120 of each of the first pair of electrodes 108A, 108B and second pair of electrodes 110A, 110B is generally spiral shaped. As such, no islands or patches associated with either of the first pair of electrodes 108A, 108B and second pair of electrodes 110A, 110B are required to electrically connect the central region 116 to the peripheral region 120, therein not necessitating an interconnect layer and providing a cleaner and less complex construction of the electrodes as compared to conventional ESCs.

In one example, the peripheral region 120 of each of the first pair of electrodes 108A, 108B and second pair of electrodes 110A, 110B approximately define a golden spiral such as a Fibonacci spiral. In the present example, the peripheral region 120 of each of the first pair of electrodes 108A, 108B and second pair of electrodes 110A, 110B generally tapers a width 128 of the respective the first pair of electrodes and second pair of electrodes toward the periphery 122 of the clamping surface 104. For example, in cases where backside gases are provided between the ESC 102 and workpiece 106, by spiraling the electrodes 108, 110 and narrowing the width 128 at the periphery 122, rigidity of the workpiece and maintaining at least a portion of an electrode nearby can keep the workpiece clamped at the periphery, thus maintaining the sealing of the backside gases between the ESC and workpiece.

In accordance with another aspect, referring again to FIG. 1, a power supply 130 is further provided and configured to selectively output a DC clamping voltage and a three-phase AC clamping voltage. A controller 132 is further provided and configured to selectively operate the ESC 102 in a DC clamping mode 134 (e.g., illustrated in FIG. 2, also called "DC mode") and an AC clamping mode 136 (e.g., illustrated in FIG. 3, also called "AC mode") based on one or more process parameters associated with a processing of the workpiece. For example, the controller 132 is configured to operate the ESC 102 in the AC mode 136 of FIG. 3 during a first set of conditions (e.g., high temperature processing, stationary processing, etc.), and is further configured to operate the ESC in the DC mode 134 of FIG. 2 when additional clamping force is desirable between the ESC and the workpiece 106 (e.g., during a low temperature process where resistivity associated with the ESC is high, during processing where workpiece movement can affect clamping, etc.).

Figure 2:
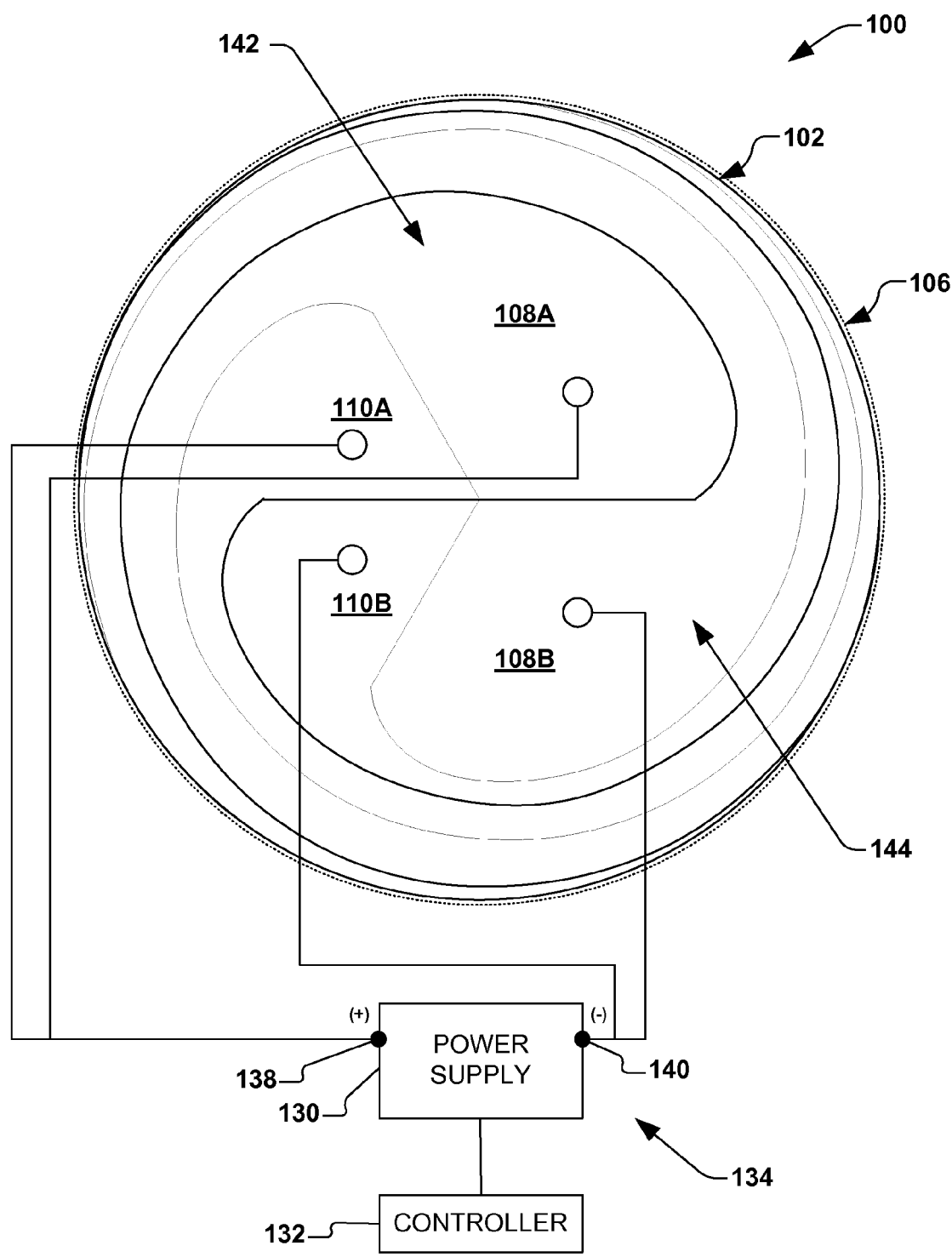
FIG. 2 is a block diagram of an exemplary electrostatic clamping system in DC clamping mode in accordance with several aspects of the present disclosure.

As illustrated in FIG. 2, for example, the DC mode 134 electrically connects one of the first pair of electrodes (e.g., electrode 108A) and one of the second pair of electrodes (e.g., electrode 110A) to a positive terminal 138 of the power supply 130 and the other one of the first pair of electrodes (e.g., electrode 108B) and other one of the second pair of electrodes (e.g., electrode 110B) to a negative terminal 140 of the power supply. Accordingly, a positive polarity area 142 (e.g., associated with electrodes 108A and 110A) is generally equal to a negative polarity area 144 (e.g., associated with electrodes 108B and 110B) in the DC mode 134. Providing such equal positive and negative polarity areas 142, 144 generally prevents charge from being imposed on the workpiece 106.

Figure 3:
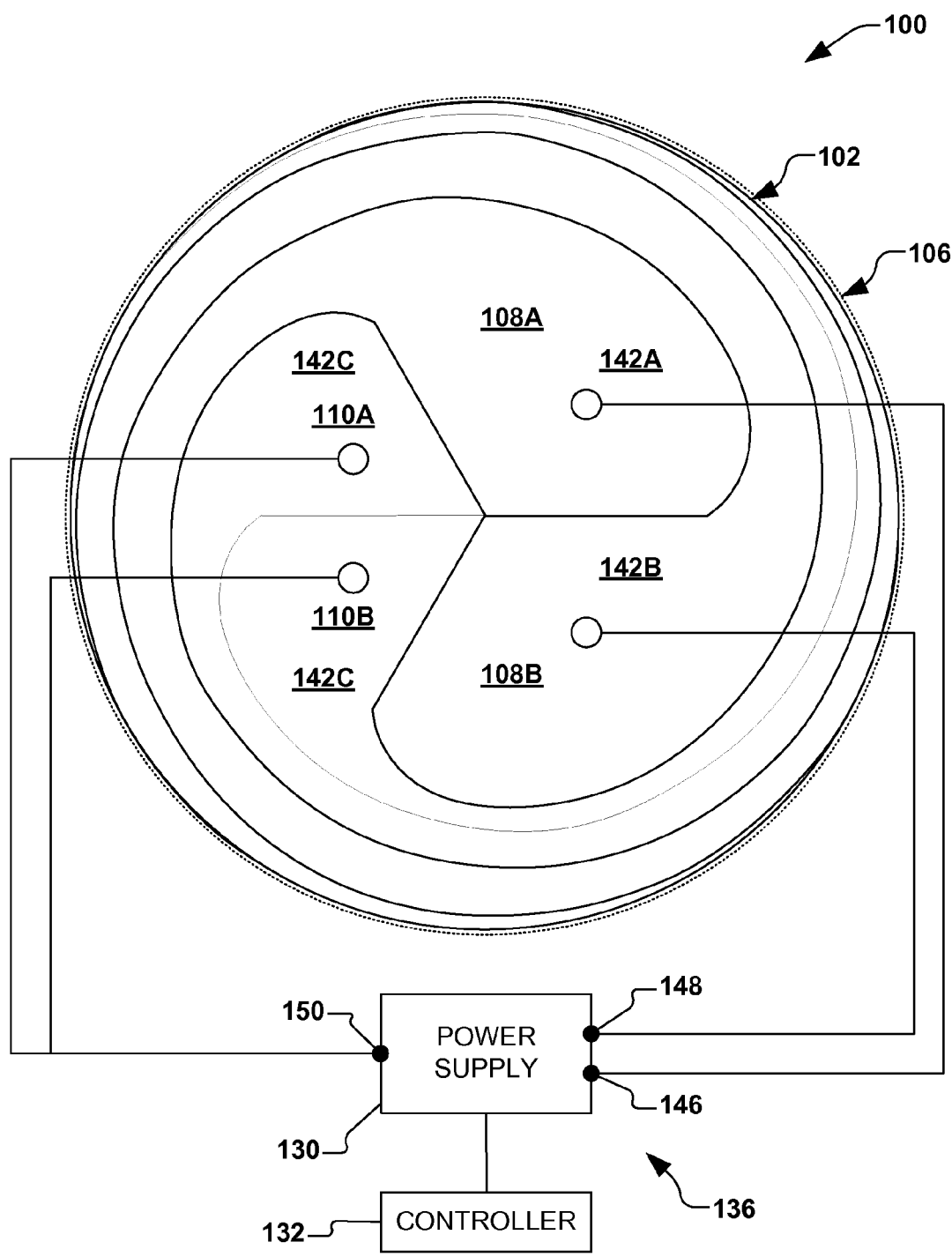
FIG. 3 is a block diagram of an exemplary electrostatic clamping system in AC clamping mode in accordance with several aspects of the present disclosure.

As illustrated in FIG. 3, for example, the AC mode 136 electrically connects a first phase terminal 146 of the power supply 130 to one of the first pair of electrodes (e.g., electrode 108A), a second phase terminal 148 of the power supply to the other one of the first pair of electrodes (e.g., electrode 108B), and a third phase terminal 150 of the power supply to both of the second pair of electrodes (e.g., electrodes 110A, 110B). Accordingly, a first phase area 142A, (e.g., associated with electrode 108A), a second phase area 142B (e.g., associated with electrode 108B) and a third phase area 142C (e.g., associated with electrodes 110A and 110B) is generally equal. Again, providing such equal first, second, and third phase areas 142A-142C generally prevents charge from being imposed on the workpiece 106.

Accordingly, the present disclosure provides the ability to switch back and forth between AC and DC operation, and such switching can be optimally performed at various temperature ranges. For example, the AC mode 136 of FIG. 3 typically has the advantage of fast declamping and quickly removing charge from the workpiece 106. Accordingly, when possible, the AC mode 136 is generally desirable. However, if resistivity changes as a function of temperature, clamping force between the workpiece 106 and the ESC 102 can be adversely affected by high temperatures. In order to regain adequate clamping force, the DC mode 134 of FIG. 2 can be selected by the controller 132, since the DC mode can provide greater clamping force to the workpiece 106 than the AC mode 136 of FIG. 3. Such switching between the AC mode 136 and DC mode 134 can be attained via switching circuitry associated with one or more of the power supply 130 and controller 132, and such switching circuitry is advantageously kept external to the configuration of the ESC 102. As such, no changes are necessary to the ESC 102, itself, as only the power being delivered to the electrodes 108, 110 is changed based on the desired AC or DC mode of operation.

Figure 4:
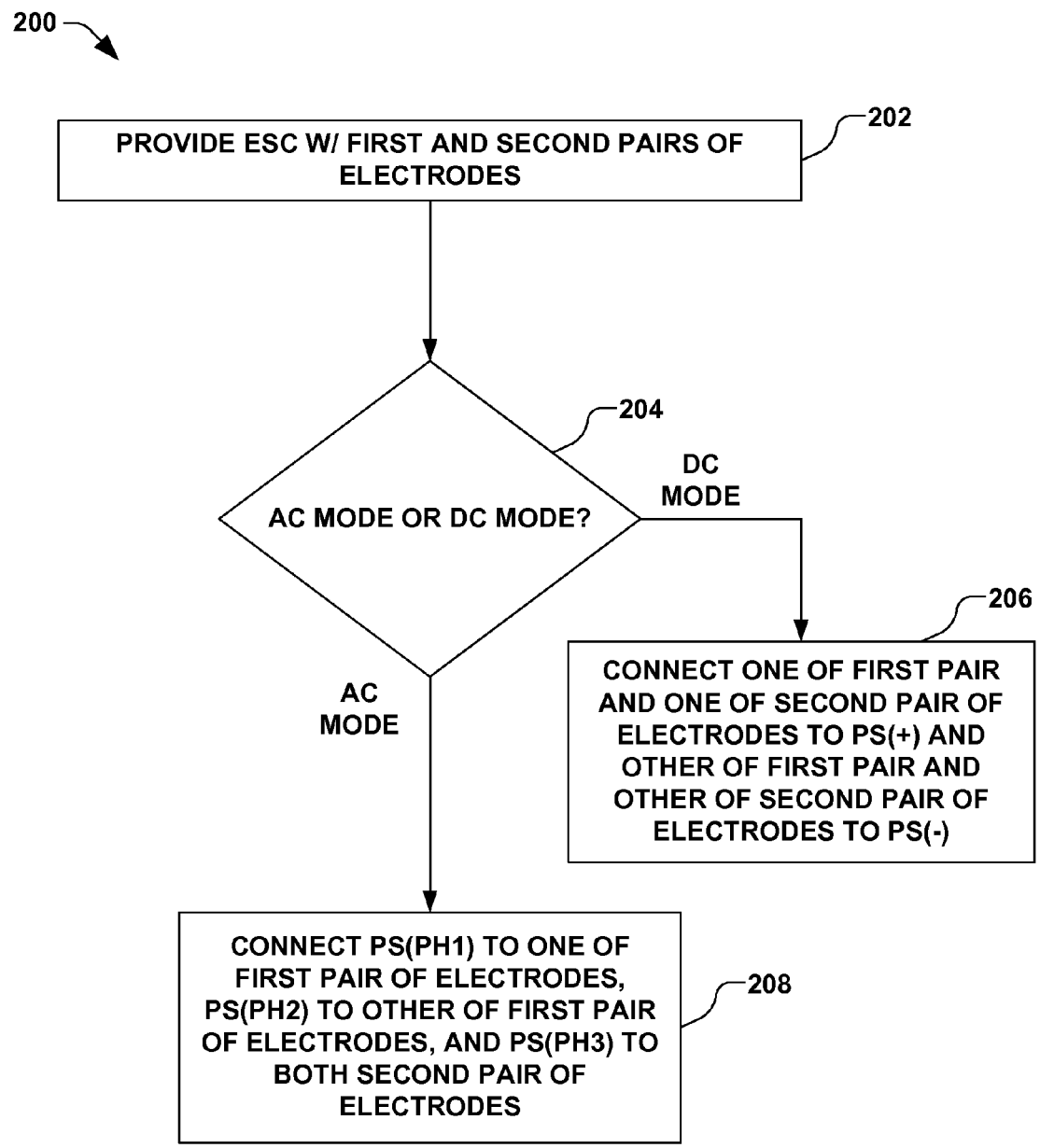
FIG. 4 illustrates a methodology for electrostatically clamping a workpiece, in accordance with still another aspect.

In accordance with yet another exemplary aspect of the invention, FIG. 4 illustrates an exemplary method 200 for clamping a workpiece to an electrostatic clamp. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 200 of FIG. 4 begins at act 202, providing an electrostatic clamp having a clamping surface associated therewith, such as the electrostatic clamp 102 of FIGS. 1-3. The electrostatic clamp provided in act 202 of FIG. 4, for example, comprises a first pair of electrodes and a second pair of electrodes, wherein each of the first pair of electrodes are associated with a respective one-third of the clamping surface, and wherein each of the second pair of electrodes are associated with a respective one-sixth of the clamping surface.

In act 204, one of a DC clamping mode and an AC clamping mode is selected based on one or more process parameters associated with a processing of the workpiece. The one or more process parameters, for example, comprise one or more of a desired clamping force between the workpiece and the electrostatic clamp and a processing temperature at which the workpiece is processed. For example, the ability to select between the DC clamping mode and AC clamping mode in act 204 advantageously permits the single ESC 102 of FIG. 1 to operate under various process conditions, such as various processing temperature ranges of the workpiece.

For example, as stated above, if the resistivity of the ESC changes as a function of temperature, AC clamping forces can be potentially limited by high resistivities associated with cold temperatures of the ESC. In order to regain clamping force between the workpiece and ESC during such low temperature operation, the DC clamping mode is selected in act 204 of FIG. 4, and a DC clamping voltage input to the ESC is operable to provide greater clamping force than a comparable an AC clamping voltage. It is again noted that providing an AC clamping voltage has an advantage during de-chucking of workpieces, as AC clamping voltages are faster at removing built-up charge from the workpiece than DC clamping voltages. Therefore, the AC clamping mode is often desirable in more circumstances than the DC clamping mode. However, when extra clamping force is desirable (e.g., a low temperature process where resistivity associated with the ESC is high), the present disclosure provides the capability of operating the same ESC in the DC clamping mode, as discussed above.

Accordingly, in act 206, when the DC clamping mode is selected in act 204, one of the first pair of electrodes and one of the second pair of electrodes are electrically connecting to a positive terminal of a DC power supply and the other one of the first pair of electrodes and other one of the second pair of electrodes to a negative terminal of the DC power supply, as illustrated in FIG. 2. Likewise, in act 208 of FIG. 4, when the AC clamping mode is selected in act 204, a first phase terminal of an AC power supply is electrically connected to one of the first pair of electrodes, a second phase terminal of the AC power supply is electrically connected to the other one of the first pair of electrodes, and a third phase terminal of the AC power supply is electrically connected to both of the second pair of electrodes, as illustrated in FIG. 3.

A workpiece can be further selectively clamped to the clamping surface of the electrostatic clamp by supplying a clamping voltage to the first and second electrodes via the DC power supply when in the DC clamping mode and the AC power supply when in the AC clamping mode. The present disclosure further contemplates the selection of one of the DC clamping mode and AC clamping mode in act 204 being performed prior to, or even during, the processing and clamping of the workpiece.

Accordingly, the present disclosure provides a novel and advantageous electrostatic clamp design that provides the ability to switch between three balanced electrodes for AC operation and two balanced electrodes for DC operation, thus providing a significantly broader temperature range in which a particular ESC can operate as compared to conventional ESCs.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An electrostatic clamping system, comprising:
an electrostatic clamp having a clamping surface associated therewith, wherein the electrostatic clamp comprises a first pair of electrodes and a second pair of electrodes, wherein each of the first pair of electrodes are associated with a respective one-third of the clamping surface, and wherein each of the second pair of electrodes are associated with a respective one-sixth of the clamping surface;
a power supply configured to selectively output a DC clamping voltage and a three-phase AC clamping voltage; and
a controller configured to selectively operate the electrostatic clamp in a DC mode and an AC mode, wherein the DC mode electrically connects one of the first pair of electrodes and one of the second pair of electrodes to a positive terminal of the power supply and the other one of the first pair of electrodes and other one of the second pair of electrodes to a negative terminal of the power supply, and wherein the AC mode electrically connects a first phase terminal of the power supply to one of the first pair of electrodes, a second phase terminal of the power supply to the other one of the first pair of electrodes, and a third phase terminal of the power supply to both of the second pair of electrodes.

2. The electrostatic clamping system of claim 1, wherein each of the first pair of electrodes and second pair of electrodes are defined by a central region associated with a center of the clamping surface and a peripheral region associated with a periphery of the clamping surface.

3. The electrostatic clamping system of claim 2, wherein an area of the central region is greater than an area of the peripheral region when viewed perpendicular to the clamping surface.

4. The electrostatic clamping system of claim 2, wherein the central region and peripheral region of each of the first pair of electrodes and second pair of electrodes are respectively contiguous to one another.

5. The electrostatic clamping system of claim 2, wherein the central region of each of the first pair of electrodes and second pair of electrodes is generally pie shaped.

6. The electrostatic clamping system of claim 5, wherein the peripheral region of each of the first pair of electrodes and second pair of electrodes is generally spiral shaped.

7. The electrostatic clamping system of claim 6, wherein the peripheral region of each of the first pair of electrodes and second pair of electrodes generally tapers a width of the respective the first pair of electrodes and second pair of electrodes toward the periphery of the clamping surface.

8. The electrostatic clamping system of claim 5, wherein the first pair of electrodes abut one another and wherein the second pair of electrodes abut one another.

9. An electrostatic clamping system, comprising:
an electrostatic clamp having a clamping surface associated therewith, wherein the electrostatic clamp comprises a first pair of electrodes and a second pair of electrodes, wherein each of the first pair of electrodes are associated with a respective one-third of the clamping surface, and wherein each of the second pair of electrodes are associated with a respective one-sixth of the clamping surface, wherein each of the first pair of electrodes and second pair of electrodes are defined by a central region associated with a center of the clamping surface and a peripheral region associated with a periphery of the clamping surface, wherein the central region of each of the first pair of electrodes and second pair of electrodes is generally pie shaped, and wherein the peripheral region of each of the first pair of electrodes and second pair of electrodes is generally spiral shaped;

a power supply configured to selectively output a DC clamping voltage and a three-phase AC clamping voltage; and a controller configured to selectively operate the electrostatic clamp in a DC mode and an AC mode, wherein the DC mode electrically connects one of the first pair of electrodes and one of the second pair of electrodes to a positive terminal of the power supply and the other one of the first pair of electrodes and other one of the second pair of electrodes to a negative terminal of the power supply, and wherein the AC mode electrically connects a first phase terminal of the power supply to one of the first pair of electrodes, a second phase terminal of the power supply to the other one of the first pair of electrodes, and a third phase terminal of the power supply to both of the second pair of electrodes.

10. The electrostatic clamping system of claim 9, wherein an area of the central region is greater than an area of the peripheral region when viewed perpendicular to the clamping surface.

11. The electrostatic clamping system of claim 9, wherein an area of the central region is approximately equal to an area of the peripheral region when viewed perpendicular to the clamping surface.

12. The electrostatic clamping system of claim 9, wherein the central region and peripheral region of each of the first pair of electrodes and second pair of electrodes are respectively contiguous to one another when viewed perpendicular to the clamping surface.

13. The electrostatic clamping system of claim 9, wherein the peripheral region of each of the first pair of electrodes and second pair of electrodes approximately define a golden spiral.

14. The electrostatic clamping system of claim 9, wherein the peripheral region of each of the first pair of electrodes and second pair of electrodes generally tapers a width of the respective the first pair of electrodes and second pair of electrodes toward the periphery of the clamping surface.

15. The electrostatic clamping system of claim 9, wherein the first pair of electrodes abut one another and wherein the second pair of electrodes abut one another.

16. A method for clamping a workpiece, the method comprising:

providing an electrostatic clamp having a clamping surface associated therewith, wherein the electrostatic clamp comprises a first pair of electrodes and a second pair of electrodes, wherein each of the first pair of electrodes are associated with a respective one-third of the clamping surface, and wherein each of the second pair of electrodes are associated with a respective one-sixth of the clamping surface;

selecting one of a DC clamping mode and an AC clamping mode based on one or more process parameters associated with a processing of the workpiece; and electrically connecting one of the first pair of electrodes and one of the second pair of electrodes to a positive terminal of a DC power supply and the other one of the first pair of electrodes and other one of the second pair of electrodes to a negative terminal of the DC power supply when the DC clamping mode is selected, and electrically connecting a first phase terminal of an AC power supply to one of the first pair of electrodes, a second phase terminal of the AC power supply to the other one of the first pair of electrodes, and a third phase terminal of the AC power supply to both of the second pair of electrodes when the AC clamping mode is selected.

17. The method of claim 16, wherein the one or more process parameters associated with processing the workpiece comprise one or more of a desired clamping force between the workpiece and the electrostatic clamp and a processing temperature at which the workpiece is processed.

18. The method of claim 16, further comprising selectively clamping the workpiece to the clamping surface of the electrostatic clamp by supplying a clamping voltage to the first and second electrodes via the DC power supply when in the DC clamping mode and the AC power supply when in the AC clamping mode.

19. The method of claim 16, wherein selecting one of the DC clamping mode and AC clamping mode is performed prior to the processing of the workpiece.

20. The method of claim 19, wherein selecting one of the DC clamping mode and AC clamping mode is further performed during to the processing of the workpiece.

* * * * *